United States Patent
Kim et al.

(10) Patent No.: US 11,783,894 B2
(45) Date of Patent: Oct. 10, 2023

(54) GAUSSIAN SAMPLING APPARATUS AND METHOD BASED ON RESISTIVE RANDOM ACCESS MEMORY

(71) Applicant: ELECTRONICS AND TELECOMMUNICATIONS RESEARCH INSTITUTE, Daejeon (KR)

(72) Inventors: Moon-Seok Kim, Daejeon (KR); Bong-Soo Lee, Daejeon (KR); Jun-Ki Kang, Daejeon (KR); Ki-Hong Kim, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 244 days.

(21) Appl. No.: 17/458,129

(22) Filed: Aug. 26, 2021

(65) Prior Publication Data
US 2022/0366975 A1     Nov. 17, 2022

(30) Foreign Application Priority Data
May 17, 2021     (KR) .................. 10-2021-0063597

(51) Int. Cl.
*G11C 13/00*     (2006.01)

(52) U.S. Cl.
CPC ........ *G11C 13/004* (2013.01); *G11C 13/0007* (2013.01); *G11C 13/0069* (2013.01); *G11C 13/0097* (2013.01); *G11C 2213/52* (2013.01)

(58) Field of Classification Search
CPC .............. G11C 13/004; G11C 13/0007; G11C 13/0069; G11C 13/0097; G11C 2213/52
(Continued)

(56) References Cited

U.S. PATENT DOCUMENTS 9,213,602 B1 * 12/2015 Alhussien ........... H03M 13/458
10,581,604 B2    3/2020 Mustafa et al.
(Continued)

FOREIGN PATENT DOCUMENTS

| KR | 10-2016-0002027 A | 1/2016 |
| KR | 10-2020-0060104 A | 5/2020 |
| KR | 10-2020-0101619 A | 8/2020 |

OTHER PUBLICATIONS

Yao Liu et al., "High-Speed Discrete Gaussian Sampler With Heterodyne Chaotic Laser Inputs," 2018 IEEE Transactions on Circuits and Systems II: Express Briefs.
(Continued)

*Primary Examiner* — Ly D Pham
(74) *Attorney, Agent, or Firm* — LRK PATENT LAW FIRM

(57) ABSTRACT

Disclosed herein are a Gaussian sampling apparatus and method based on resistive RAM. The Gaussian sampling apparatus based on resistive RAM includes Resistive RAM (RRAM) in which a resistive switching layer is disposed between an upper electrode and a lower electrode, and a sampling controller, wherein the sampling controller is configured to perform an operation corresponding to an erase command of applying a reset voltage to the RRAM when a Gaussian error request is received from an outside of the Gaussian sampling apparatus, perform an operation corresponding to a program command of applying a set voltage to the RRAM after the operation corresponding to the erase command has been completed, perform an operation of reading resistance data from the RRAM, and provide a response to the outside of the Gaussian sampling apparatus by transmitting the resistance data of the RRAM as Gaussian error data.

14 Claims, 4 Drawing Sheets

(58) Field of Classification Search
USPC .......................................................... 711/104
See application file for complete search history.

(56) References Cited

U.S. PATENT DOCUMENTS

| | | |
|---|---|---|
| 11,055,229 B2 | 7/2021 | Oh |
| 11,126,403 B2 | 9/2021 | Yang et al. |
| 2012/0061639 A1* | 3/2012 | Yasuda .................. H10B 63/20 |
| | | 257/E45.001 |
| 2017/0178710 A1 | 6/2017 | Augustine et al. |
| 2017/0242660 A1 | 8/2017 | Katoh |
| 2018/0151224 A1 | 5/2018 | Chih et al. |
| 2022/0374302 A1* | 11/2022 | Kim .................. G11C 16/0466 |

OTHER PUBLICATIONS

Ayesha Khalid et al., "Compact, Scalable, and Efficient Discrete Gaussian Samplers for Lattice-Based Cryptography," 2018 IEEE International Symposium on Circuits and Systems (ISCAS).
Raymond K. Zhao et al., "FACCT: FAst, Compact, and Constant-Time Discrete Gaussian Sampler over Integers," 2020 IEEE Transactions on Computers.

* cited by examiner

GAUSSIAN SAMPLING APPARATUS AND METHOD BASED ON RESISTIVE RANDOM ACCESS MEMORY

CROSS REFERENCE TO RELATED APPLICATION

This application claims the benefit of Korean Patent Application No. 10-2021-0063597, filed May 17, 2021, which is hereby incorporated by reference in its entirety into this application.

BACKGROUND OF THE INVENTION

1. Technical Field

The following embodiments relate to a Gaussian sampling apparatus and method.

2. Description of Related Art

With the development of quantum technology, implementation of quantum computer technology has attracted attention in various research fields. In particular, Shor's algorithm, which can be implemented only in quantum computing, increases an integer factorization speed to ten million times that of an existing computing scheme. This means that, without applying quantum computing such as a Rivest, Shamir, and Adleman (RSA) cryptosystem, a cipher cannot perform its own cryptography function.

In order to solve this problem in cryptography technology, standards for Post Quantum Cryptography (PQC) technology have been established under the supervision of the U.S. National Institute of Standards and Technology (NIST).

Among PQC technologies, one promising technology to be established as a standard is lattice-based cryptography technology. Lattice-based cryptography is an asymmetric cryptography scheme which performs encryption by applying a public key and intentional error information to a message. An attacker cannot decrypt the corresponding message unless the attacker has the public key and the intentional error information.

Such intentional error information means error information in a Gaussian distribution, and a device for outputting errors to a Gaussian distribution is called a Gaussian sampler.

In the past, the function of the Gaussian sampler was implemented by combining a real random number generator with a Field-Programmable Gate Array (FPGA) or a software circuit.

However, the real random number generator has high overhead with regard to implementation area and speed, and the FPGA or the software circuit also has high overhead with regard to implementation area.

SUMMARY OF THE INVENTION

An embodiment is intended to provide a Gaussian sampling apparatus based on Resistive Random Access Memory (RRAM or ReRAM), which is equipped with two types of characteristics, such as a high degree of integration using the physical characteristics of a semiconductor unit device and fast reading/writing, without requiring a real random number generator.

In accordance with an aspect, there is provided a Gaussian sampling apparatus based on a Resistive Random Access Memory (RRAM), including a Resistive Random Access Memory (RRAM) in which a resistive switching layer is disposed between an upper electrode and a lower electrode, and a sampling controller, wherein the sampling controller is configured to perform an operation corresponding to an erase command of applying a reset voltage to the RRAM when a Gaussian error data request is received from an outside of the Gaussian sampling apparatus, perform an operation corresponding to a program command of applying a set voltage to the RRAM after the operation corresponding to the erase command has been completed, perform an operation of reading resistance data from the RRAM, and provide a response to the outside of the Gaussian sampling apparatus by transmitting the resistance data of the RRAM as Gaussian error data.

Each of the upper electrode and the lower electrode may be made of a conductive material including one of aluminum, platinum, copper, and titanium.

The resistive switching layer may be made of a metal oxide or perovskite.

The resistive switching layer may be configured to switch a resistance state from a high resistance state to a low resistance state when the set voltage is applied to the upper electrode and the lower electrode, and switch the resistance state from a low resistance state to a high resistance state when the reset voltage is applied to the upper electrode and the lower electrode.

The set voltage and the reset voltage may have different polarities.

The set voltage and the reset voltage may have an identical polarity and have different magnitudes.

The Gaussian sampling apparatus may further include an analog-to-digital converter for converting analog resistance data of the RRAM into digital resistance data and outputting the digital resistance data to the sampling controller.

In accordance with another aspect, there is provided a Gaussian sampling method based on a Resistive Random Access Memory (RRAM), including, when a Gaussian error data request is received from an outside, performing an operation corresponding to an erase command of applying a reset voltage to the RRAM, after the operation corresponding to the erase command is completed, performing an operation corresponding to a program command of applying a set voltage to the RRAM, performing an operation of reading resistance data from the RRAM, and providing a response to the outside by transmitting the resistance data of the RRAM as Gaussian error data, wherein the RRAM is configured such that a resistive switching layer is disposed between an upper electrode and a lower electrode.

Each of the upper electrode and the lower electrode may be made of a conductive material including one of aluminum, platinum, copper, and titanium.

The resistive switching layer may be made of a metal oxide or perovskite.

The resistive switching layer may be configured to switch a resistance state from a high resistance state to a low resistance state when the set voltage is applied to the upper electrode and the lower electrode, and switch the resistance state from a low resistance state to a high resistance state when the reset voltage is applied to the upper electrode and the lower electrode.

The set voltage and the reset voltage may have different polarities.

The set voltage and the reset voltage may have an identical polarity and have different magnitudes.

Providing the response may include converting analog resistance data of the RRAM into digital resistance data.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
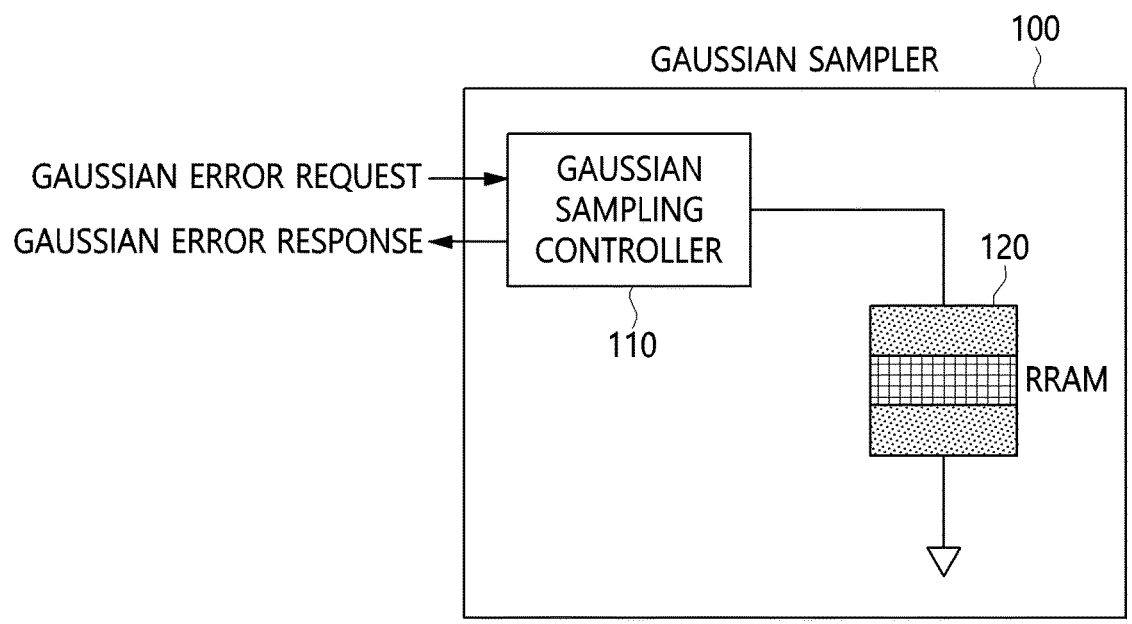
FIG. 1 is a schematic configuration diagram of a Gaussian sampling apparatus based on resistive RAM according to an embodiment.

Advantages and features of the present invention and methods for achieving the same will be clarified with reference to embodiments described later in detail together with the accompanying drawings. However, the present invention is capable of being implemented in various forms, and is not limited to the embodiments described later, and these embodiments are provided so that this invention will be thorough and complete and will fully convey the scope of the present invention to those skilled in the art. The present invention should be defined by the scope of the accompanying claims. The same reference numerals are used to designate the same components throughout the specification.

It will be understood that, although the terms "first" and "second" may be used herein to describe various components, these components are not limited by these terms. These terms are only used to distinguish one component from another component. Therefore, it will be apparent that a first component, which will be described below, may alternatively be a second component without departing from the technical spirit of the present invention.

The terms used in the present specification are merely used to describe embodiments, and are not intended to limit the present invention. In the present specification, a singular expression includes the plural sense unless a description to the contrary is specifically made in context. It should be understood that the term "comprises" or "comprising" used in the specification implies that a described component or step is not intended to exclude the possibility that one or more other components or steps will be present or added.

Unless differently defined, all terms used in the present specification can be construed as having the same meanings as terms generally understood by those skilled in the art to which the present invention pertains. Further, terms defined in generally used dictionaries are not to be interpreted as having ideal or excessively formal meanings unless they are definitely defined in the present specification.

Hereinafter, a Gaussian sampling apparatus and method based on Resistive Random Access Memory (RRAM or ReRAM) according to embodiments will be described in detail with reference to FIGS. 1 to 7.

FIG. 1 is a schematic configuration diagram of a Gaussian sampling apparatus based on resistive RAM (RRAM) according to an embodiment.

Referring to FIG. 1, a Gaussian sampling apparatus (hereinafter also referred to as a "Gaussian sampler") 100 based on resistive RAM according to an embodiment may include a Gaussian sampling controller 110 and Resistive Random Access Memory (RRAM) 120.

The RRAM 120 is a memory device using characteristics whereby the resistance value of a resistive switching material varies with a voltage condition. The RRAM 120 is very advantageous from the standpoint of the degree of integration because a memory operation is enabled through a simple structure composed of metal, a resistive switching layer, and metal, is advantageous in that manufacturing costs are decreased because a manufacturing process thereof is simpler than that of flash memory, commercialized as nonvolatile memory, and is also advantageous in that fast read/write speeds may be implemented. These advantages will be described in detail later with reference to FIGS. 2 to 5.

When a Gaussian error data request (or a Gaussian error request) is received from the outside of the Gaussian sampling apparatus, the Gaussian sampling controller 110 may output resistance data of the RRAM 120 as a Gaussian error data response (or a Gaussian error response). The detailed operation thereof will be described later with reference to FIG. 5.

Further, although not illustrated in the drawing, the Gaussian sampling apparatus 100 based on RRAM may further include an Analog-to-Digital Converter (ADC) for converting analog resistance data of the RRAM 120 into digital resistance data and outputting the digital resistance data to the Gaussian sampling controller 110.

Figure 2:
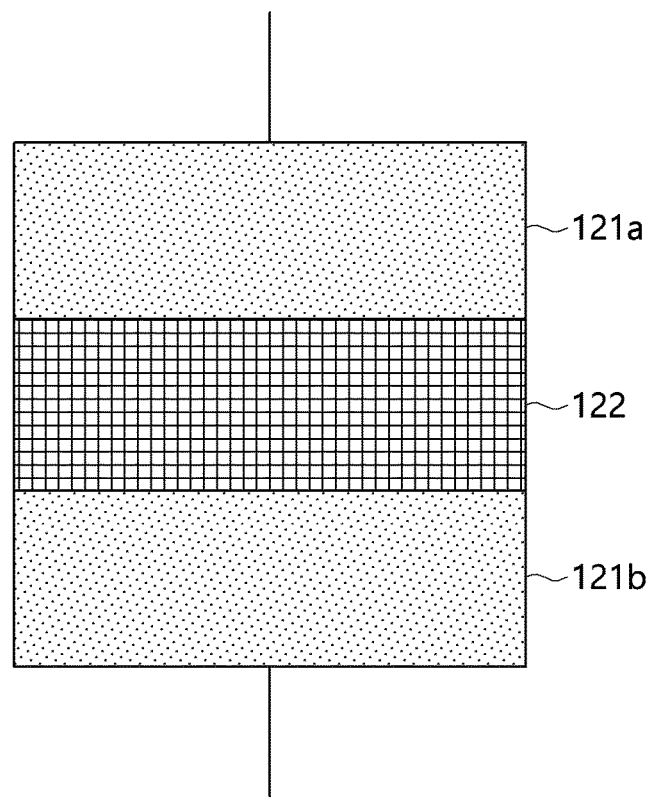
FIG. 2 is a sectional view of the structure of resistive RAM according to an embodiment.
Figure 3:
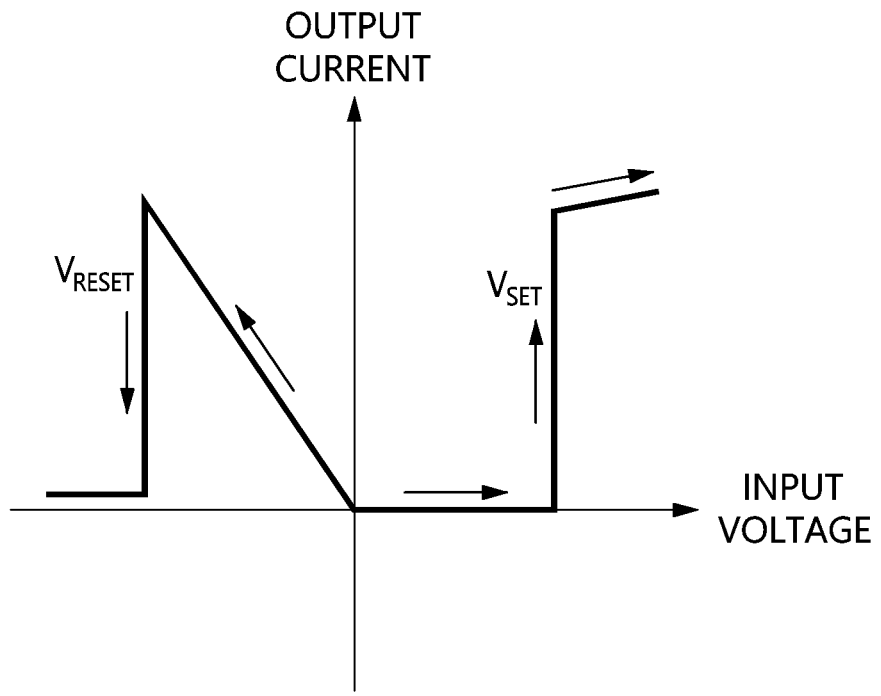
FIG. 3 is a graph of an input voltage/output current waveform for explaining bipolar resistive switching.
Figure 4:
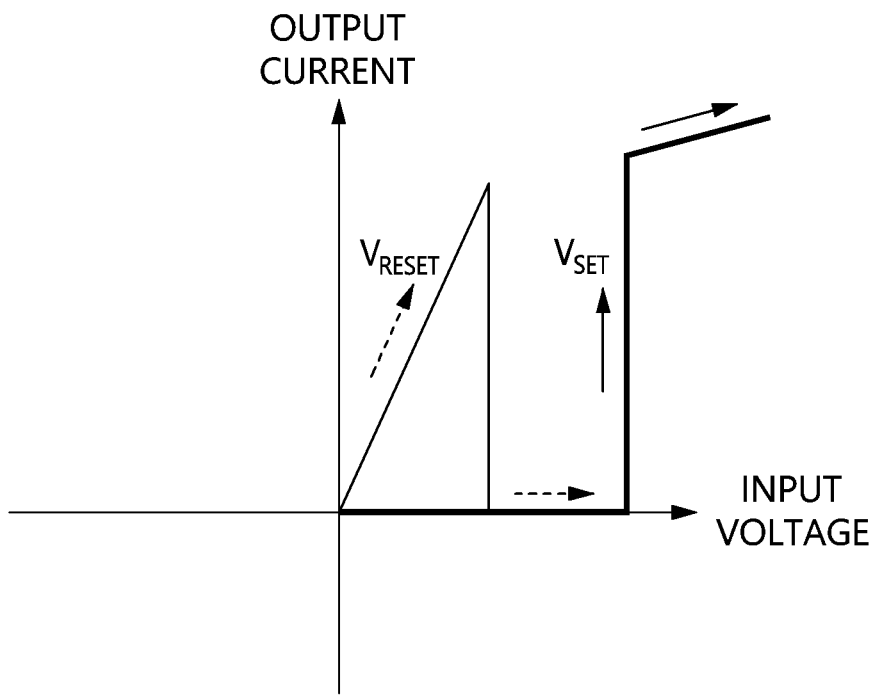
FIG. 4 is a graph of an input voltage/output current waveform for explaining unipolar resistive switching.

FIG. 2 is a sectional view of the structure of resistive RAM according to an embodiment, FIG. 3 is a graph of an input voltage/output current waveform for explaining bipolar resistive switching, and FIG. 4 is a graph of an input voltage/output current waveform for explaining unipolar resistive switching.

Referring to FIG. 2, each of memory cells forming the RRAM 120 is configured such that a resistive switching layer 122 is disposed between an upper electrode 121a and a lower electrode 121b.

Here, each of the upper electrode 121a and the lower electrode 121b may be made of a conductive material. Here, the conductive material may be metal including aluminum, platinum, copper, titanium, etc.

Here, the resistive switching layer 122 may be made of a material showing variable resistance characteristics. Here, the material showing variable resistance characteristics may include the metal oxides $Al_2O_3$, $Cu_2O$, $TiO_2$, $ZnO$, and IGZO, or perovskite $SrTiO_3$.

Here, the resistive switching layer 122 may switch the resistance value thereof by varying the voltage to be applied to the upper electrode 121a and the lower electrode 121b. That is, the resistive switching layer 122 may have two states, that is, a high-resistance state (HRS) and a low-resistance state (LRS). Therefore, the two states of the resistive switching layer 122 may be distinguished from each other, and thus the RRAM may function as memory.

In detail, the resistive switching layer 122 may switch the resistance state thereof from a high-resistance state (HRS) to a low-resistance state (LRS) as a set voltage $V_{SET}$ is applied to the upper electrode 121a and the lower electrode 121b.

In contrast, the resistive switching layer 122 may switch the resistance state thereof from a low-resistance state (LRS) to a high-resistance state (HRS) when a reset voltage VRESET is applied to the upper electrode 121a and the lower electrode 121b.

Here, suitable voltage conditions required to cause resistive switching may be mainly classified into bipolar resistive switching and unipolar resistive switching. Here, the polarity may indicate a direction in which voltage is to be applied.

In accordance with an embodiment, the set voltage $V_{SET}$ and the reset voltage VRESET may have different polarities. That is, this means that, as illustrated in FIG. 3, the bipolar resistive switching implements an LRS when writing is performed using a positive (+) voltage, and implements an HRS when writing is performed using a negative (−) voltage. However, the present invention is not limited thereto. That is, depending on the physical and chemical characteristics of the resistive RAM (RRAM) device, the case where an HRS is implemented when writing is performed using a negative voltage and an LRS is implemented when writing is performed using a positive voltage may also be present.

In another embodiment, the set voltage $V_{SET}$ and the reset voltage $V_{RESET}$ may have the same polarity, and may have different magnitudes. That is, referring to FIG. 4, resistive switching, which causes an LRS to be implemented when voltage is applied with the magnitude of the set voltage and causes an HRS to be implemented when voltage is applied with the magnitude of the reset voltage even if the voltage is applied in the same direction, is referred to as "unipolar resistive switching". Unipolar resistive switching means that an LRS and a HRS are distinguished from each other depending on the magnitude of a write voltage, even in the case of voltage in the same direction.

Generally, the resistive switching mechanism of the RRAM 120 may vary, but the resistive switching mechanism of the RRAM 120 will be described through the most representative filament model.

The resistive switching layer 122 between metal materials originally has the characteristics of an insulator.

When the set voltage $V_{SET}$ is applied to the insulator between metal materials, a filament connecting the metal materials to each other is formed in an oxygen-vacancy region of the resistive switching layer 122, and the resistance state of the unit cell of the RRAM becomes an LRS.

In contrast, when the reset voltage VRESET is applied to the insulator between the metal materials, the filament of the resistive switching layer 122 is disconnected, and thus the resistance state of the resistive switching layer 122 becomes an HRS.

Figure 5:
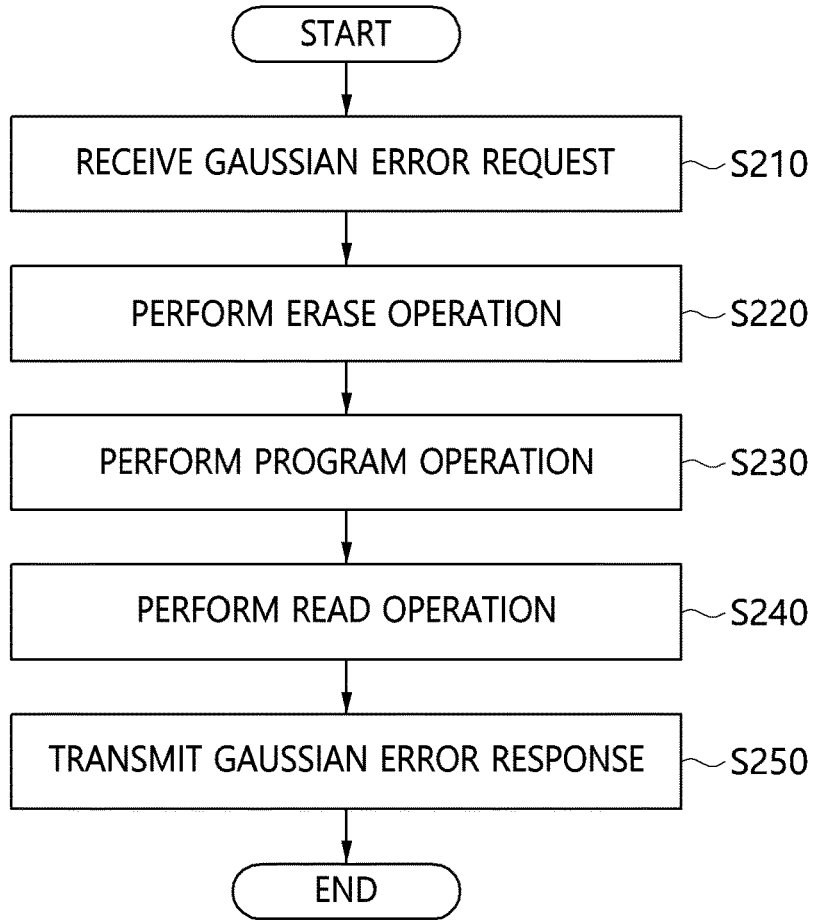
FIG. 5 is a flowchart illustrating a Gaussian sampling method based on resistive RAM according to an embodiment.
Figure 6:
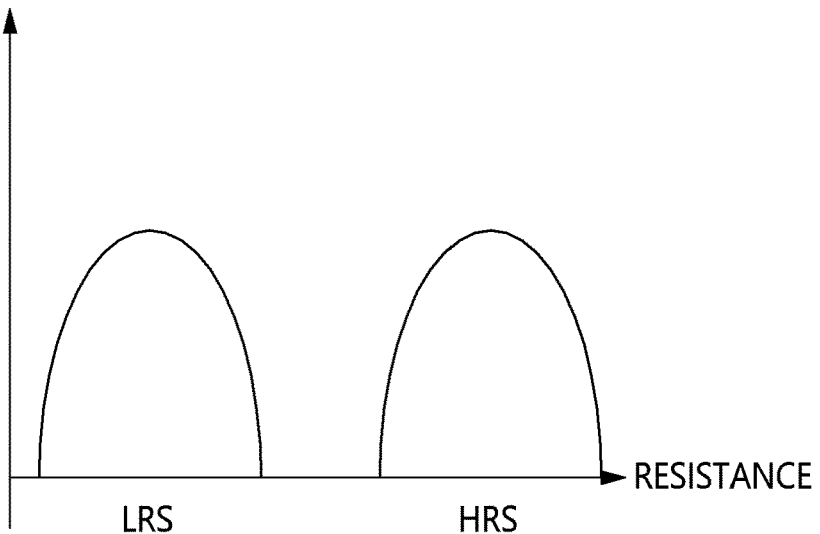
FIG. 6 is a conceptual diagram for explaining the resistance deviation of resistive RAM.

FIG. 5 is a flowchart illustrating a Gaussian sampling method based on resistive RAM (RRAM) according to an embodiment, and FIG. 6 is a conceptual diagram for explaining the resistance deviation of the RRAM.

Referring to FIG. 5, when a Gaussian error data request is received from the outside of the Gaussian sampling apparatus (or Gaussian sampler) at step S210, the Gaussian sampling controller 110 executes an operation corresponding to an erase command on the RRAM 120 at step S220.

Here, the erase command may be a command for switching the resistance state of the RRAM 120 to an HRS by applying a reset voltage VRESET to the RRAM 120.

The Gaussian sampling controller 110 performs an operation corresponding to a program command on the RRAM 120 on which the operation corresponding to the erase command has been performed at step S230.

Here, the program command may be a command for switching the resistance state to an LRS by applying a set voltage $V_{SET}$ to the RRAM 120.

Here, the resistance distribution of the RRAM 120 may have an unpredictable normal distribution.

Referring to FIG. 6, a graph of LRS resistance Gaussian distribution depending on the performance of repetitive resistive switching of a unit cell in the RRAM is illustrated on the left side of the drawing, and a graph of HRS resistance Gaussian distribution depending on the performance of repetitive resistive switching of the unit cell in the RRAM is illustrated on the right side of the drawing.

Whenever the operations corresponding to the resistive switching erase/program commands are performed at steps S220 and S230, the RRAM 120 has a resistance distribution corresponding to a normal Gaussian distribution.

That is, whenever resistance changes due to the physical characteristics of the RRAM device, the RRAM 120 has an unpredictable resistance distribution corresponding to the normal Gaussian distribution.

The Gaussian sampling controller 110 performs a read operation on resistance data based on the above-described resistance distribution having an unpredictable normal Gaussian distribution at step S240.

The Gaussian sampling controller 110 provides a response to the outside of the Gaussian sampling apparatus by transmitting the resistance data of the RRAM as Gaussian error data at step S250.

Here, the resistance data may be used as output to be transmitted to the outside of the Gaussian sampling apparatus (i.e., the Gaussian sampler) based on output voltage data obtained by applying a constant current.

The analog resistance data of the RRAM 120 may be converted into digital data, and then the digital data may be output.

The operating principle of the above-described Gaussian sampling apparatus based on RRAM is based on a deviation between normal distributions of resistance magnitudes that unpredictably occur in each program/erase operation. This indicates the inherent physical characteristics of the RRAM itself. Through the operation of the Gaussian sampling apparatus, a normal distribution error signal that is logically unpredictable is output. This result contributes to intentional error generation technology, which is an element essential for implementation of Post-Quantum Cryptography (PQC) lattice-based cryptography.

Figure 7:
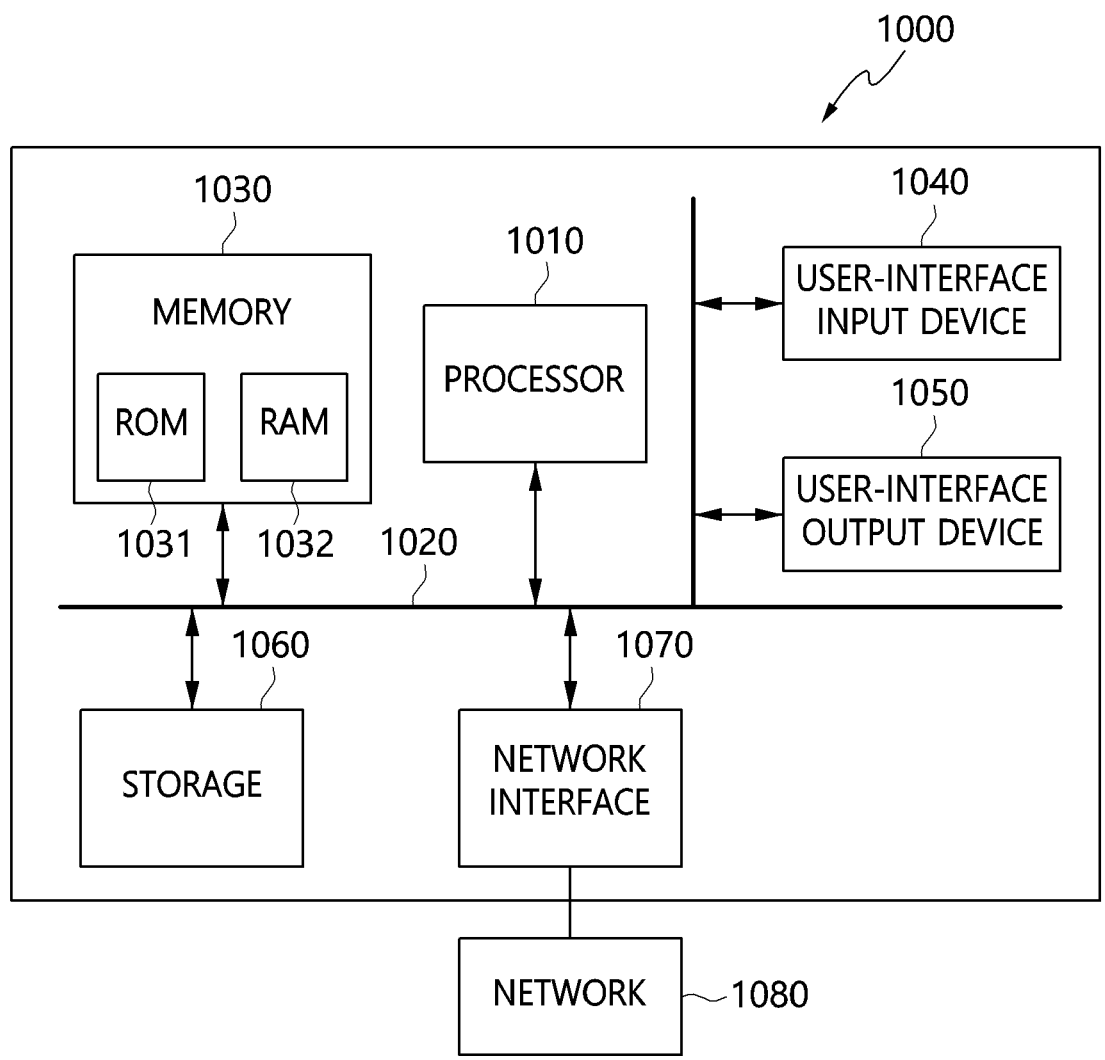
FIG. 7 is a diagram illustrating the configuration of a computer system according to an embodiment.

FIG. 7 is a diagram illustrating the configuration of a computer system according to an embodiment.

A Gaussian sampling apparatus based on resistive RAM (RRAM) according to an embodiment may be implemented in a computer system 1000 such as a computer-readable storage medium.

The computer system 1000 may include one or more processors 1010, memory 1030, a user interface input device 1040, a user interface output device 1050, and storage 1060, which communicate with each other through a bus 1020. The computer system 1000 may further include a network interface 1070 connected to a network 1080. Each processor 1010 may be a Central Processing Unit (CPU) or a semiconductor device for executing programs or processing instructions stored in the memory 1030 or the storage 1060. Each of the memory 1030 and the storage 1060 may be a storage medium including at least one of a volatile medium, a nonvolatile medium, a removable medium, a non-removable medium, a communication medium, or an information delivery medium. For example, the memory 1030 may include Read-Only Memory (ROM) 1031 or Random Access Memory (RAM) 1032.

Owing to the high degree of integration and fast write/read speeds, resistive random access memory, which is attracting attention as next-generation nonvolatile memory subsequent to flash memory, may also be used as a Gaussian sampler as well as a device for performing a memory function.

In the past, a Gaussian sampling apparatus based on resistive random access memory was implemented by combining a real random number generator with an FPGA or a software circuit. However, the real random number generator has high overhead with regard to implementation area and speed, and the FPGA or the software circuit also has high overhead with regard to implementation area.

Therefore, the resistive random access memory may be utilized as a Gaussian sampler while maintaining characteristics of a high degree of integration and fast write/read speeds, which are advantages of the resistive random access memory.

The resistive random access memory according to the embodiment may perform a memory operation using a simple structure composed of metal, a resistive switching layer, and metal to thus have an advantage from the standpoint of the degree of integration, may have a simple manufacturing process to reduce manufacturing costs, and may implement fast memory read/write speeds.

Although the embodiments of the present invention have been disclosed with reference to the attached drawing, those skilled in the art will appreciate that the present invention can be implemented in other concrete forms, without changing the technical spirit or essential features of the invention. Therefore, it should be understood that the foregoing embodiments are merely exemplary, rather than restrictive, in all aspects.

What is claimed is:

1. A Gaussian sampling apparatus based on a Resistive Random Access Memory (RRAM), comprising:
   a Resistive Random Access Memory (RRAM) in which a resistive switching layer is disposed between an upper electrode and a lower electrode; and
   a sampling controller,
   wherein the sampling controller is configured to:
   perform an operation corresponding to an erase command of applying a reset voltage to the RRAM when a Gaussian error data request is received from an outside of the Gaussian sampling apparatus,
   perform an operation corresponding to a program command of applying a set voltage to the RRAM after the operation corresponding to the erase command has been completed,
   perform an operation of reading resistance data from the RRAM, and
   provide a response to the outside of the Gaussian sampling apparatus by transmitting the resistance data of the RRAM as Gaussian error data.

2. The Gaussian sampling apparatus of claim 1, wherein each of the upper electrode and the lower electrode is made of a conductive material including one of aluminum, platinum, copper, and titanium.

3. The Gaussian sampling apparatus of claim 1, wherein the resistive switching layer is made of a metal oxide or perovskite.

4. The Gaussian sampling apparatus of claim 1, wherein the resistive switching layer is configured to:
   switch a resistance state from a high resistance state to a low resistance state when the set voltage is applied to the upper electrode and the lower electrode, and
   switch the resistance state from a low resistance state to a high resistance state when the reset voltage is applied to the upper electrode and the lower electrode.

5. The Gaussian sampling apparatus of claim 4, wherein the set voltage and the reset voltage have different polarities.

6. The Gaussian sampling apparatus of claim 4, wherein the set voltage and the reset voltage have an identical polarity and have different magnitudes.

7. The Gaussian sampling apparatus of claim 1, further comprising:
   an analog-to-digital converter for converting analog resistance data of the RRAM into digital resistance data and outputting the digital resistance data to the sampling controller.

8. A Gaussian sampling method based on a Resistive Random Access Memory (RRAM), comprising:
   when a Gaussian error data request is received from an outside, performing an operation corresponding to an erase command of applying a reset voltage to the RRAM;
   after the operation corresponding to the erase command is completed, performing an operation corresponding to a program command of applying a set voltage to the RRAM;
   performing an operation of reading resistance data from the RRAM; and
   providing a response to the outside by transmitting the resistance data of the RRAM as Gaussian error data,
   wherein the RRAM is configured such that a resistive switching layer is disposed between an upper electrode and a lower electrode.

9. The Gaussian sampling method of claim 8, wherein each of the upper electrode and the lower electrode is made of a conductive material including one of aluminum, platinum, copper, and titanium.

10. The Gaussian sampling method of claim 8, wherein the resistive switching layer is made of a metal oxide or perovskite.

11. The Gaussian sampling method of claim 8, wherein the resistive switching layer is configured to:
   switch a resistance state from a high resistance state to a low resistance state when the set voltage is applied to the upper electrode and the lower electrode, and
   switch the resistance state from a low resistance state to a high resistance state when the reset voltage is applied to the upper electrode and the lower electrode.

12. The Gaussian sampling method of claim 11, wherein the set voltage and the reset voltage have different polarities.

13. The Gaussian sampling method of claim 11, wherein the set voltage and the reset voltage have an identical polarity and have different magnitudes.

14. The Gaussian sampling method of claim 8, wherein providing the response comprises:
   converting analog resistance data of the RRAM into digital resistance data.

* * * * *